(12) United States Patent
Sandberg et al.

(10) Patent No.: US 10,665,635 B1
(45) Date of Patent: May 26, 2020

(54) PERSISTENT FLUX BIASING METHODOLOGY FOR SUPERCONDUCTING LOOPS

(71) Applicant: INTERNATIONAL BUSINESS MACHINES CORPORATION, Armonk, NY (US)

(72) Inventors: Martin O. Sandberg, Ossining, NY (US); Sami Rosenblatt, White Plains, NY (US); Rasit O. Topaloglu, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/395,061

(22) Filed: Apr. 25, 2019

(51) Int. Cl.
| | |
|---|---|
| *H01L 27/18* | (2006.01) |
| *H01L 39/24* | (2006.01) |
| *H03K 19/195* | (2006.01) |
| *G06N 10/00* | (2019.01) |
| *H01L 39/02* | (2006.01) |
| *H01L 39/22* | (2006.01) |
| *H01L 39/12* | (2006.01) |
| *H01L 39/08* | (2006.01) |

(52) U.S. Cl.
CPC ............ *H01L 27/18* (2013.01); *G06N 10/00* (2019.01); *H01L 39/025* (2013.01); *H01L 39/2493* (2013.01); *H03K 19/195* (2013.01); *H01L 39/08* (2013.01); *H01L 39/12* (2013.01); *H01L 39/223* (2013.01)

(58) Field of Classification Search
None
See application file for complete search history.

(56) References Cited

U.S. PATENT DOCUMENTS

| | | | |
|---|---|---|---|
| 6,025,713 A | 2/2000 | Morooka et al. | |
| 6,728,131 B2 | 4/2004 | Ustinov | |
| 7,042,004 B2 | 5/2006 | Magnus et al. | |
| 7,990,662 B2 | 8/2011 | Berkley et al. | |
| 8,812,066 B2 | 8/2014 | Lanting et al. | |
| 2005/0162302 A1 | 7/2005 | Omelyanchouk et al. | |
| 2009/0168286 A1* | 7/2009 | Berkley | B82Y 10/00 361/141 |
| 2012/0135867 A1* | 5/2012 | Thom | H01P 1/202 505/210 |

FOREIGN PATENT DOCUMENTS

WO        2009052635 A1    4/2009

OTHER PUBLICATIONS

Mr. SQUID User's Guide, STAR Cryoelectonics, LLC 1996-2000, New Mexico, U.S.A.

\* cited by examiner

*Primary Examiner* — Jany Richardson
(74) *Attorney, Agent, or Firm* — Henry J. Daley; Laura G. Remus; Venable LLP

(57) ABSTRACT

A tunable qubit device includes a tunable qubit, the tunable qubit including a superconducting quantum interference device (SQUID) loop. The tunable qubit device further includes a superconducting loop inductively coupled to the SQUID loop, and a flux bias line inductively coupled to the superconducting loop. The superconducting loop includes a superconducting material having a critical temperature that is a lower temperature than a critical temperature of any superconducting material of the tunable qubit. In operation, the superconducting loop provides a persistent bias to the tunable qubit.

20 Claims, 4 Drawing Sheets

PERSISTENT FLUX BIASING METHODOLOGY FOR SUPERCONDUCTING LOOPS

BACKGROUND

The present invention relates to flux biasing methodology, and more specifically, to persistent flux biasing methodology for superconducting loops.

Superconducting qubits are one of the main candidates for building a quantum processor. There are several different styles of superconducting qubits. Some have a frequency that is tunable with magnetic flux, enabling the qubit frequency to be tweaked to avoid cross-talk between qubits. Magnetic flux is applied to the qubit using an external flux bias line, wherein a current through the flux bias line creates a magnetic field that changes the qubit frequency. However, flux tunable qubits are very sensitive to noise coming from the external flux bias line. Noise in the external flux bias line causes dephasing of the qubit, shortening the lifetime of any quantum state, and limiting the effectiveness of the qubit in the quantum processor.

SUMMARY

According to an embodiment of the present invention, a tunable qubit device includes a tunable qubit, the tunable qubit including a superconducting quantum interference device (SQUID) loop. The tunable qubit device further includes a superconducting loop inductively coupled to the SQUID loop, and a flux bias line inductively coupled to the superconducting loop. The superconducting loop includes a superconducting material having a critical temperature that is a lower temperature than a critical temperature of any superconducting material of the tunable qubit. In operation, the superconducting loop provides a persistent bias to the tunable qubit.

According to an embodiment of the present invention, a method of producing a tunable qubit device includes forming, on a first surface of a substrate, a tunable qubit comprising a SQUID loop. The method further includes forming, on a second surface of the substrate, the second surface opposing the first surface, a superconducting loop comprising a superconducting material having a critical temperature that is a lower temperature than a critical temperature of each superconducting material of the tunable qubit. The method further includes forming, on the second surface of the substrate, a flux bias line inductively coupled to the superconducting loop. The superconducting loop is inductively coupled to the SQUID loop, and, in operation, the superconducting loop provides a persistent bias to the tunable qubit.

According to an embodiment of the present invention, a method of tuning a tunable qubit device including a SQUID loop and a bias superconducting loop includes raising the temperature of the tunable qubit device from a temperature suitable for operation of the tunable qubit to a temperature above a critical temperature of the bias superconducting loop but below a critical temperature of each superconducting material of the SQUID loop. The method further includes applying a magnetic field to the bias superconducting loop using a flux bias line, and reducing the temperature of the tunable qubit device to a temperature below the critical temperature of the bias superconducting loop, thereby trapping a flux in the bias superconducting loop. The method further includes removing the magnetic field applied by the flux bias line while maintaining the persistent bias current in the bias superconducting loop. The magnetic field created by the persistent bias current in the superconducting loop penetrates the SQUID loop, tuning a frequency of the tunable qubit.

According to an embodiment of the present invention, a quantum computer includes a refrigeration system under vacuum comprising a containment vessel, and a qubit chip contained within a refrigerated vacuum environment defined by the containment vessel, wherein the qubit chip comprises a plurality of tunable qubit devices. The quantum computer further includes a plurality of electromagnetic waveguides arranged within the refrigerated vacuum environment so as to direct electromagnetic energy to and receive electromagnetic energy from at least a selected one of the plurality of tunable qubit devices. Each of the plurality of tunable qubit devices includes a tunable qubit, the tunable qubit comprising a SQUID loop; a superconducting loop inductively coupled to the SQUID loop; and a flux bias line inductively coupled to the superconducting loop. The superconducting loop comprises a superconducting material having a critical temperature that is a lower temperature than a critical temperature of any superconducting material of the tunable qubit. In operation, the superconducting loop provides a persistent bias to the tunable qubit.

DETAILED DESCRIPTION

Figure 1:
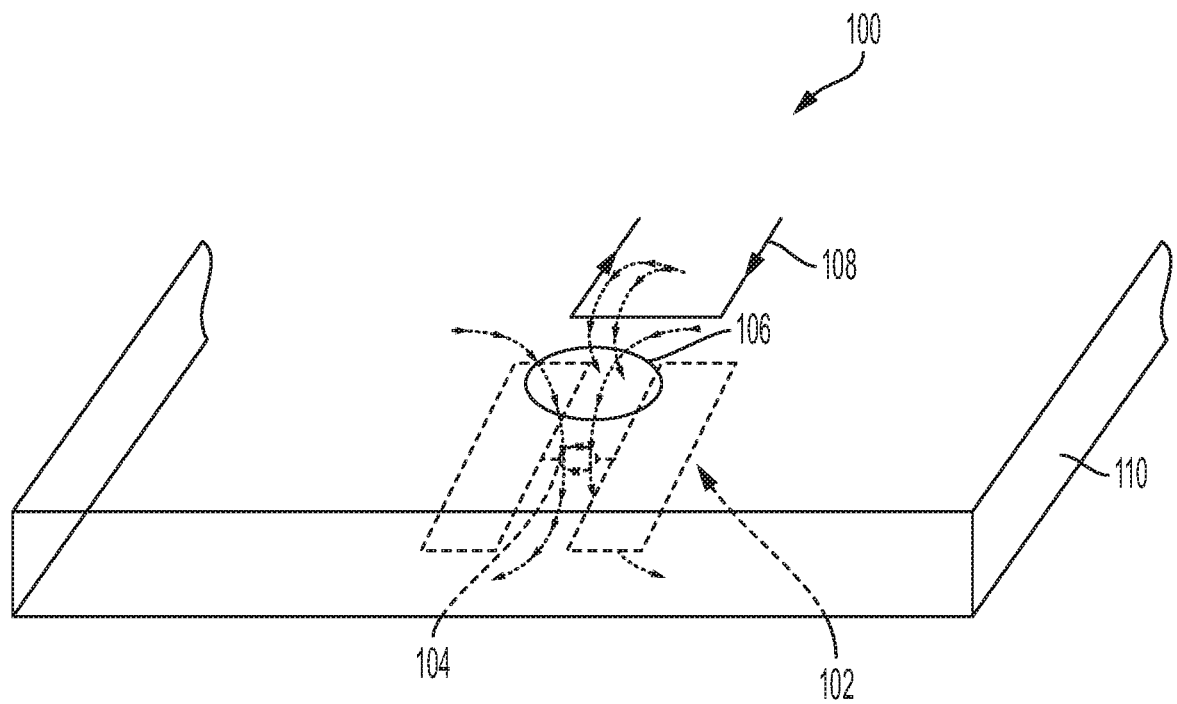
FIG. 1 is a schematic illustration of a tunable qubit device according to an embodiment of the invention.

FIG. 1 is a schematic illustration of a tunable qubit device 100 according to an embodiment of the invention. The tunable qubit device 100 includes a tunable qubit 102. The tunable qubit 102 includes a superconducting quantum interference device (SQUID) loop 104. The tunable qubit device 100 also includes a superconducting loop 106 inductively coupled to the SQUID loop 104, and a flux bias line 108 inductively coupled to the superconducting loop 106. The superconducting loop 106 comprises a superconducting material having a critical temperature that is a lower temperature than a critical temperature of any superconducting material of the tunable qubit 102. In operation, the superconducting loop 106 provides a persistent bias to the tunable qubit 102.

Herein, the word "persistent" is defined as constant and continuous. The persistent bias may persist for a period of time that is much longer than other characteristic times of the system. For example, the period of time may be much longer than the relaxation and dephasing times of the tunable qubit. The period of time may be a period of minutes, hours, or days. The period of time may continue for the length of time that the temperature of the system is maintained below the critical temperature of the superconducting material of the superconducting loop.

According to an embodiment of the invention, the tunable qubit device 100 further includes a substrate 110. The SQUID loop 104 may be formed on a first surface of the substrate 110, and the superconducting loop 106 may be formed on a second surface of the substrate opposing the first surface, as shown in FIG. 1.

Figure 2:
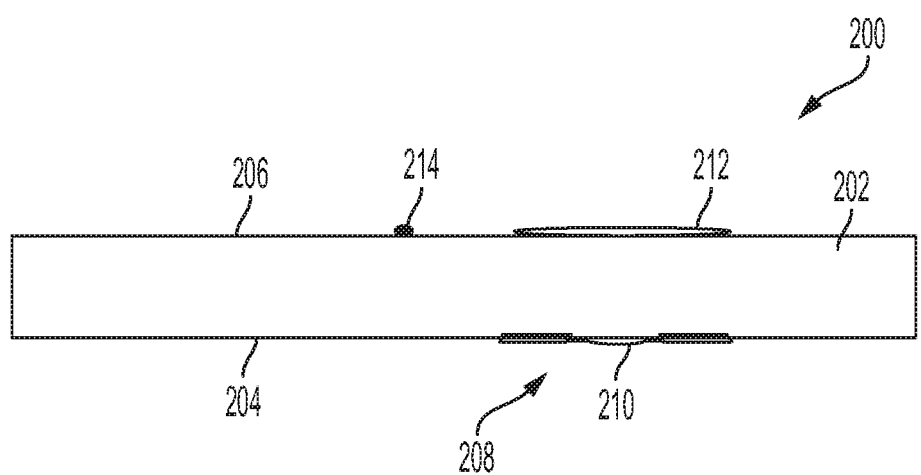
FIG. 2 is a schematic illustration of a tunable qubit device according to an embodiment of the invention.

FIG. 2 is a schematic illustration of a tunable qubit device 200 according to an embodiment of the invention. FIG. 2 shows a side view of a substrate 202. The substrate 202 has a first surface 204 and a second surface 206 opposite the first surface 204. The tunable qubit device 200 has a tunable qubit 208 including a SQUID loop 210 formed on the first surface 204. The tunable qubit device 200 has a superconducting loop 212 formed on the second surface 206. The superconducting loop 212 is inductively coupled to the SQUID loop 210. The tunable qubit device 200 also has a flux bias line 214 inductively coupled to the superconducting loop 212.

According to an embodiment of the invention, the SQUID loop 210 is formed to be substantially in a first plane, and the superconducting loop 212 is formed to be substantially in a second plane that is spaced apart from and substantially parallel to the first plane. According to an embodiment of the invention, the SQUID loop 210 and the superconducting loop 212 are aligned so as to maximize inductive coupling between the SQUID loop 210 and the superconducting loop 212. For example, in a side view of the substrate 202, the superconducting loop 212 may be vertically aligned with the SQUID loop 210, as shown in FIG. 2. The center of the superconducting loop 212 may be vertically aligned with the center of the SQUID loop 210. Alternatively, the center of the superconducting loop 212 may be laterally offset from the center of the SQUID loop 210 in the side view. The superconducting loop 212 may completely or partially overlay the SQUID loop 210.

The inductive coupling between the superconducting loop 212 and the SQUID loop 210 may depend on the extent to which the superconducting loop 212 and the SQUID loop 210 are aligned. For example, the inductive coupling may be maximized when the superconducting loop 212 and the SQUID loop are aligned such that the superconducting loop 212 completely overlays the SQUID loop 210.

According to an embodiment of the invention, the superconducting loop creates a magnetic field that tunes a frequency of the tunable qubit. Often, only a very small tuning of the qubit frequency is needed to avoid frequency collisions. The tuning is conventionally achieved by applying a magnetic flux to the tunable qubit using a flux bias line. However, the flux bias line introduces noise into the system, which results in dephasing of the tunable qubit. Even small fluctuations in the bias current that is used to control the frequency of the tunable qubit can have a devastating effect on the qubit's coherence. Accordingly, embodiments of the invention employ a superconducting loop to create a persistent magnetic field that tunes the frequency of a tunable qubit.

According to an embodiment of the invention, the superconducting loop continues to create the magnetic field when no magnetic field is created by the flux bias line. As described in more detail below, a user can introduce a magnetic flux into the superconducting loop using a flux bias line. By controlling the temperature of the system, the user can trap the magnetic flux in the superconducting loop such that the magnetic flux remains in the loop even after the flux bias line ceases to create the magnetic field. In this way, the tunable qubit is isolated from the noisy flux bias line, while still being tuned by the persistent flux trapped in the superconducting loop.

According to an embodiment of the invention, the superconducting loop includes one or more of titanium, zirconium, or hafnium, for example. The tunable qubit may include one or more of niobium, aluminum, and titanium nitride, for example.

Figure 3:
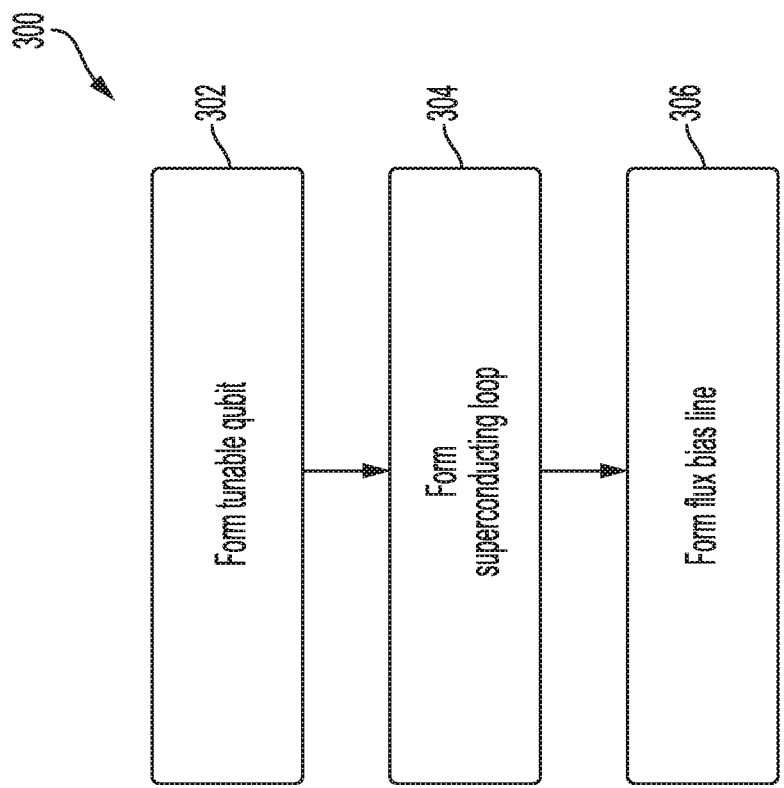
FIG. 3 is a flowchart that illustrates a method of producing a quantum computer chip according to an embodiment of the current invention.

FIG. 3 is a flowchart that illustrates a method 300 of producing a quantum computer chip according to an embodiment of the current invention. The method 300 includes forming, on a first surface of a substrate, a tunable qubit 302 comprising a superconducting quantum interference device (SQUID) loop. The method 300 further includes forming, on a second surface of the substrate, the second surface opposing the first surface, a superconducting loop 304 comprising a superconducting material having a critical temperature that is a lower temperature than a critical temperature of each superconducting material of the tunable qubit. The method further includes forming, on the second surface of the substrate, a flux bias line 306 inductively coupled to the superconducting loop. The superconducting loop is inductively coupled to the SQUID loop, and in operation, the superconducting loop provides a persistent bias to the tunable qubit.

Figure 4:
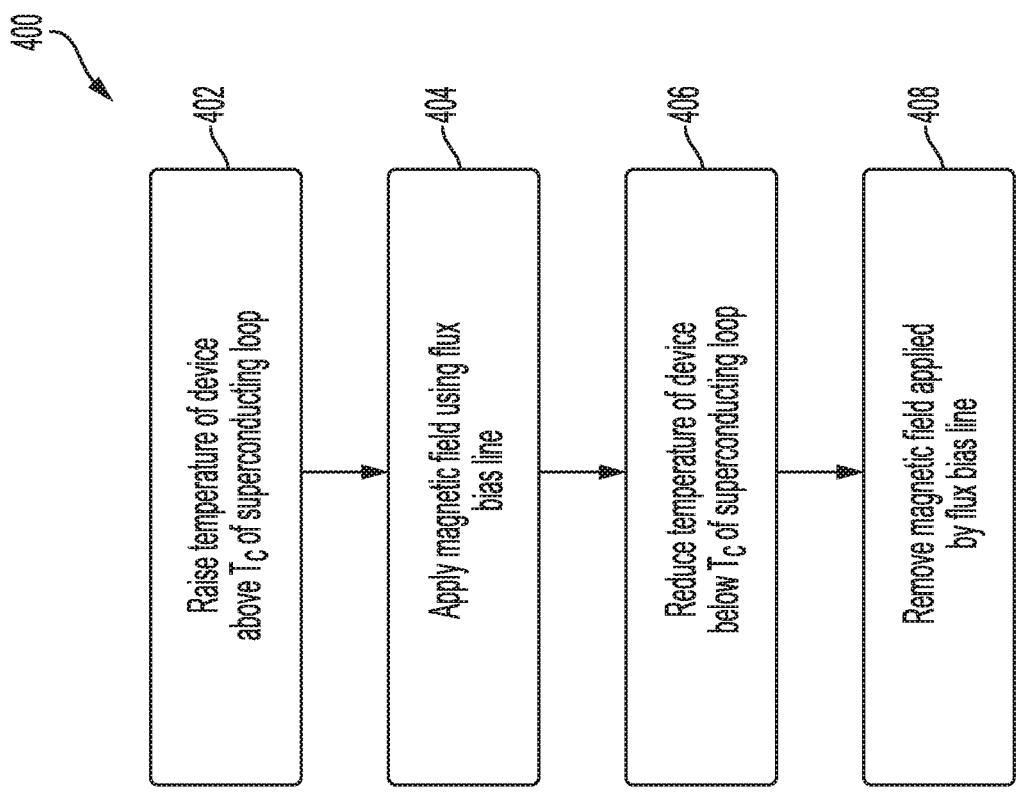
FIG. 4 is a flowchart that illustrates a method of tuning the tunable qubit using the persistent bias current in the superconducting loop.

According to an embodiment of the invention, the method further includes tuning the tunable qubit 308 using a persistent bias current in the superconducting loop, wherein the persistent bias current persists when flux from the flux bias line is removed. FIG. 4 is a flowchart that illustrates a method 400 of tuning the tunable qubit using the persistent bias current in the superconducting loop. The method 400 includes raising the temperature of the tunable qubit device from a temperature suitable for operation of the tunable qubit to a temperature above the critical temperature of the superconducting loop 402 but below the critical temperature of each superconducting material of the tunable qubit. At this temperature, the material of the superconducting loop ceases to be superconducting, but the superconducting material or materials forming the tunable qubit remain superconducting. The temperature suitable for operation of the tunable qubit may be less than 100 mK, for example. The temperature of the tunable qubit device may be raised from less than 100 mK to a temperature above the critical temperature of the superconducting loop 402 but below the critical temperature of each superconducting material of the tunable qubit. For example, if the superconducting loop is formed from titanium and the tunable qubit is formed from niobium and aluminum, then the temperature of the tunable qubit device may be raised from less than 100 mK to a temperature above 0.39 K, the critical temperature of titanium, but below 1.20 K, which is the lower of the critical temperatures of niobium ($T_C$=9.26 K) and aluminum ($T_C$=1.20 K).

The method 400 further includes applying a magnetic field to the superconducting loop using the flux bias line 404. Because the flux bias line is inductively coupled to the superconducting loop, a current in the flux bias line will have a corresponding magnetic field that acts on the superconducting loop, causing a flux to penetrate the superconducting loop. The method 400 further includes reducing the temperature of the tunable qubit device to a temperature below the critical temperature of the superconducting loop 406, thereby trapping a flux in the superconducting loop. As the material forming the superconducting loop returns to a superconducting state, the flux that is penetrating the superconducting loop area will be trapped in the superconducting loop.

The method 400 further includes removing the magnetic field applied by the flux bias line 408 while maintaining the persistent bias current in the superconducting loop. Because the flux penetrating the superconducting loop is trapped in the superconducting loop, the current in the flux bias line is no longer needed. Accordingly, the magnetic field applied by the flux bias line can be removed. When the current in the flux bias line is reduced to zero, the coherence of the tunable qubit is no longer affected by noise in the flux bias line.

The magnetic field created by the persistent bias current in the superconducting loop penetrates the SQUID loop, tuning a frequency of the tunable qubit. Because the superconducting loop is inductively coupled to the SQUID loop, the trapped magnetic flux inside the superconducting loop partially penetrates the SQUID loop. The extent to which the magnetic flux trapped in the superconducting loop penetrates the SQUID loop is determined by the mutual inductance M between the superconducting loop and the SQUID loop. The penetrating flux causes a displacement of the critical current of the SQUID. The change in the critical current results in a change in the frequency of the tunable qubit. Further, because the magnetic flux is trapped in the superconducting loop, the superconducting loop will provide a persistent, i.e., constant and continuing, flux that penetrates the SQUID loop. Thus, the frequency of the qubit will remain tuned as long at the temperature of the tunable qubit device is maintained below the critical temperature of the superconducting loop.

Figure 5:
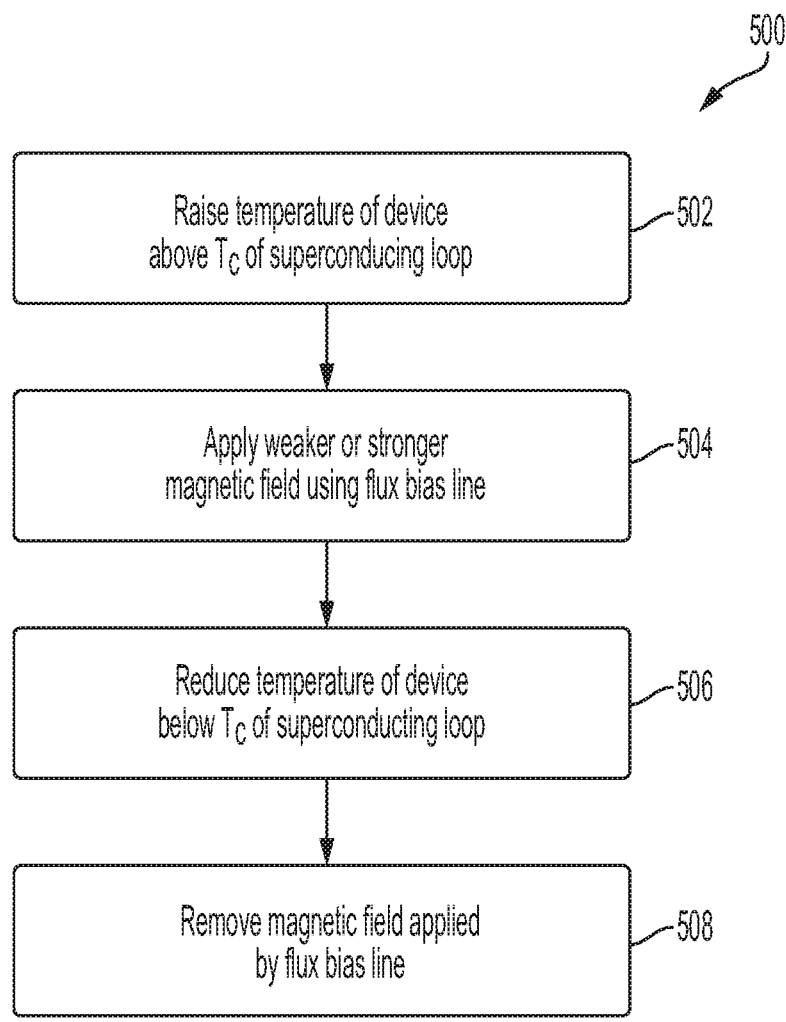
FIG. 5 is a flowchart that illustrates a method for further tuning the frequency of the tunable qubit.

The method according to an embodiment of the invention includes further tuning the frequency of the tunable qubit. For example, after the initial tuning of the tunable qubit, a user may decide to adjust frequency of the qubit by changing the magnetic field created by the superconducting loop. FIG. 5 is a flowchart that illustrates a method 500 for further tuning the frequency of the tunable qubit. The method 500 includes raising the temperature of the tunable qubit device to a temperature above the critical temperature of the superconducting loop 502 but below the critical temperature of each superconducting material of the tunable qubit. The method 500 further includes applying a magnetic field to the superconducting loop that is weaker or stronger than a previously applied magnetic field using the flux bias line 504. The method 500 includes reducing the temperature of the tunable qubit device to a temperature below the critical temperature of the second superconducting loop 506. The method 500 further includes removing the magnetic field applied by the flux bias line 508.

As described above, the tunable qubit device 100 schematically illustrated in FIG. 1 includes a superconducting loop 106 that produces a magnetic field that tunes the tunable qubit 102. In some applications, only semi-static tuning is desirable where the system operates in a static state and occasionally re-tuning may be needed. This would for instance be for transmon, charge, or phase qubit systems incorporating a SQUID loop and where the cross-resonance gate is used; a small tunability would be desirable to avoid frequency collisions. The following estimation of performance assumes that the superconducting loop has a radius $R_1$, and the SQUID loop has a radius $R_2$, where $R_2<R_1$. The amount of current circulating for one stored flux quantum $\Phi_0$ in the top bias loop is given by $I_{bias}=\Phi_0/L_{self}$ with $$L_{self} \approx \mu_0 R_1 \left( \log\left(\frac{16 R_1}{d}\right) - 2 \right)$$

where d=1 µm is the width of the wire forming the superconducting loop.

The mutual inductance is given by $$\approx \frac{\mu_0 \pi R_1^2 R_2^2}{2(R_1^2 + H^2)^{3/2}},$$

where H is the thickness of the substrate on which the superconducting loop and the SQUID loop are formed. Taking $R_1$=100 µm, $R_2$=10 µm, H=250 µm gives a mutual inductance M≈0.1 pH. To suppress the critical current in the qubit SQUID loop by one percent, a current of 1 mA is circulated in the bias loop, approximately corresponding to approximately 325 flux quanta trapped in the loop. This is sufficient to tune the frequency of a 5 GHz transmon qubit by about 25 MHz.

Figure 6:
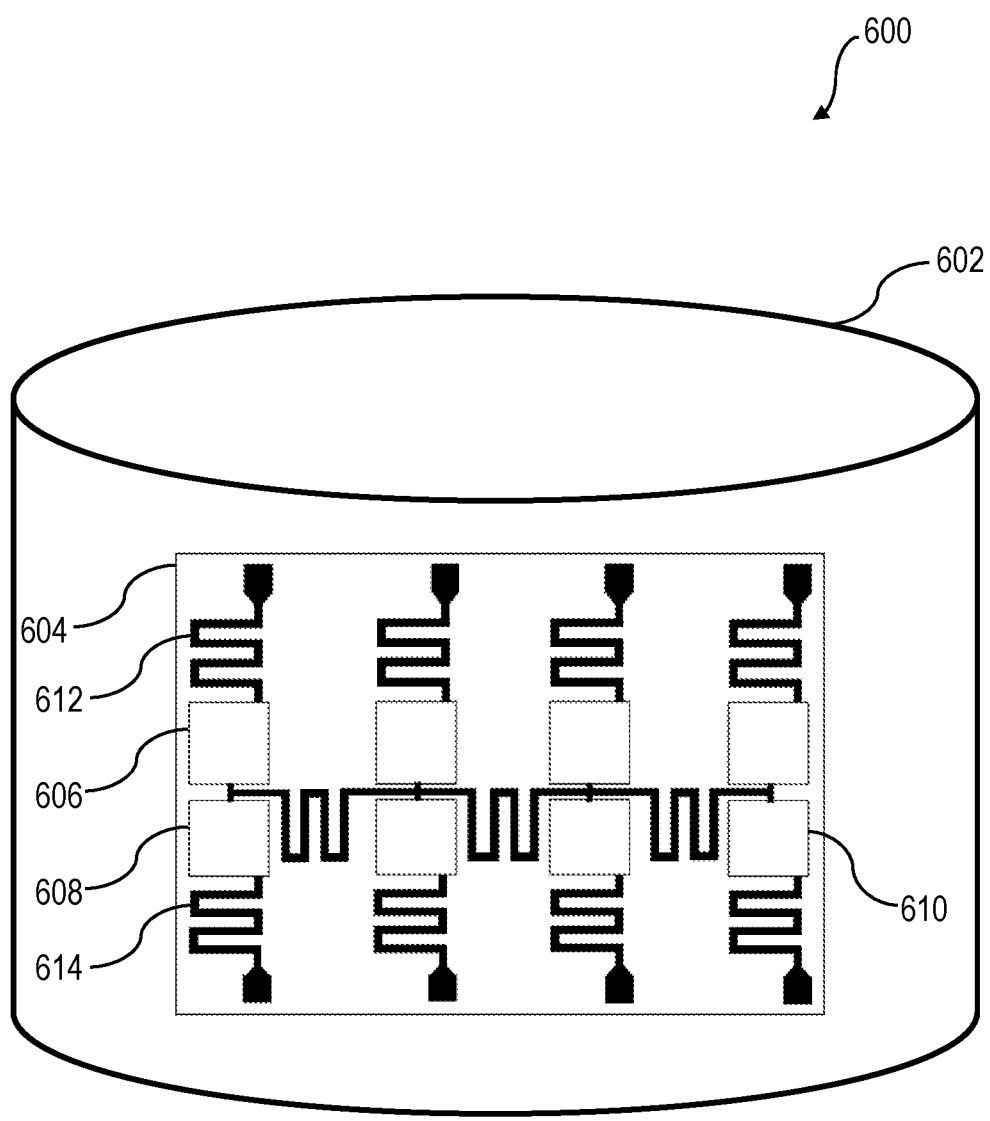
FIG. 6 is a schematic illustration of a quantum computer according to an embodiment of the invention.

A plurality of tunable qubit device may be used to form a quantum computer. FIG. 6 is a schematic illustration of a quantum computer 600 according to an embodiment of the invention. The quantum computer 600 includes a refrigeration system under vacuum including a containment vessel 602. The quantum computer 600 includes a qubit chip 604 contained within a refrigerated vacuum environment defined by the containment vessel 602. The qubit chip 604 comprises a plurality of tunable qubit devices 606, 608, 610. The quantum computer 600 also includes a plurality of electromagnetic waveguides 612, 614 arranged within the refrigerated vacuum environment so as to direct electromagnetic energy to and receive electromagnetic energy from at least a selected one of the plurality of tunable qubit devices 606, 608, 610. The tunable qubit devices 606, 608, 610 each include a tunable qubit, a superconducting loop, and a flux bias line, like the tunable qubit device 100 in FIG. 1. The frequency of each tunable qubit can be individually tuned by trapping a magnetic flux in the corresponding superconducting loop, using the corresponding flux bias line. A different magnetic flux can be trapped in each superconducting loop, allowing for individualized, persistent tuning of each tunable qubit.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:
1. A tunable qubit device comprising:
   a tunable qubit, the tunable qubit comprising a superconducting quantum interference device (SQUID) loop;
   a superconducting loop inductively coupled to the SQUID loop; and
   a flux bias line inductively coupled to the superconducting loop, wherein the superconducting loop comprises a superconducting material having a critical temperature that is a lower temperature than a critical temperature of any superconducting material of the tunable qubit, and wherein, in operation, the superconducting loop tunes a frequency of the tunable qubit by providing a persistent bias to the tunable qubit.

2. The tunable qubit device according to claim 1, wherein the superconducting loop creates a magnetic field that tunes a frequency of the tunable qubit.

3. The tunable qubit device according to claim 2, wherein the superconducting loop continues to create the magnetic field when no magnetic field is created by the flux bias line.

4. The tunable qubit device according to claim 1, wherein the superconducting loop has a radius that is greater than a radius of the SQUID loop.

5. The tunable qubit device according to claim 1, wherein the superconducting loop comprises one of titanium, zirconium, or hafnium.

6. The tunable qubit device according to claim 1, wherein the tunable qubit comprises one of niobium, aluminum, and titanium nitride, and wherein the superconducting loop comprises one of titanium, zirconium, or hafnium.

7. A tunable qubit device comprising:
a tunable qubit, the tunable qubit comprising a superconducting quantum interference device (SQUID) loop;
a superconducting loop inductively coupled to the SQUID loop;
a flux bias line inductively coupled to the superconducting loop; and
a substrate,
wherein the superconducting loop comprises a superconducting material having a critical temperature that is a lower temperature than a critical temperature of any superconducting material of the tunable qubit,
wherein, in operation, the superconducting loop provides a persistent bias to the tunable qubit, and
wherein the SQUID loop is formed on a first surface of the substrate, and the superconducting loop is formed on a second surface of the substrate opposing the first surface.

8. A tunable qubit device comprising:
a tunable qubit, the tunable qubit comprising a superconducting quantum interference device (SQUID) loop;
a superconducting loop inductively coupled to the SQUID loop; and
a flux bias line inductively coupled to the superconducting loop,
wherein the superconducting loop comprises a superconducting material having a critical temperature that is a lower temperature than a critical temperature of any superconducting material of the tunable qubit,
wherein, in operation, the superconducting loop provides a persistent bias to the tunable qubit,
wherein the SQUID loop is formed to be substantially in a first plane,
wherein the superconducting loop is formed to be substantially in a second plane, the second plane being spaced apart from and substantially parallel to the first plane, and
wherein the SQUID loop and the superconducting loop are aligned so as to maximize inductive coupling between the SQUID loop and the superconducting loop.

9. A tunable qubit device comprising:
a tunable qubit, the tunable qubit comprising a superconducting quantum interference device (SQUID) loop;
a superconducting loop inductively coupled to the SQUID loop; and
a flux bias line inductively coupled to the superconducting loop,
wherein the superconducting loop comprises a superconducting material having a critical temperature that is a lower temperature than a critical temperature of any superconducting material of the tunable qubit,
wherein, in operation, the superconducting loop provides a persistent bias to the tunable qubit,
wherein the SQUID loop is formed to be substantially in a first plane,
wherein the superconducting loop is formed to be substantially in a second plane, the second plane being spaced apart from and substantially parallel to the first plane, and
wherein the SQUID loop and the superconducting loop are aligned so as to be concentric.

10. A method of producing a tunable qubit device, comprising:
forming, on a first surface of a substrate, a tunable qubit comprising a superconducting quantum interference device (SQUID) loop;
forming, on a second surface of the substrate, the second surface opposing the first surface, a superconducting loop comprising a superconducting material having a critical temperature that is a lower temperature than a critical temperature of each superconducting material of the tunable qubit; and
forming, on the second surface of the substrate, a flux bias line inductively coupled to the superconducting loop,
wherein the superconducting loop is inductively coupled to the SQUID loop, and
wherein, in operation, the superconducting loop provides a persistent bias to the tunable qubit.

11. The method of claim 10, wherein forming the superconducting loop comprises aligning the superconducting loop with the SQUID loop so as to maximize inductive coupling between the SQUID loop and the superconducting loop.

12. The method of claim 10, further comprising:
tuning the tunable qubit using a persistent bias current in the superconducting loop, wherein the persistent bias current persists when flux from the flux bias line is removed.

13. The method of claim 10, wherein tuning the tunable qubit using a persistent bias current in the superconducting loop comprises:
raising the temperature of the tunable qubit device from a temperature suitable for operation of the tunable qubit to a temperature above the critical temperature of the superconducting loop but below the critical temperature of each superconducting material of the tunable qubit;
applying a magnetic field to the superconducting loop using the flux bias line;
reducing the temperature of the tunable qubit device to a temperature below the critical temperature of the superconducting loop, thereby trapping a flux in the superconducting loop; and
removing the magnetic field applied by the flux bias line while maintaining the persistent bias current in the superconducting loop,
wherein the magnetic field created by the persistent bias current in the superconducting loop penetrates the SQUID loop, tuning a frequency of the tunable qubit.

14. The method of claim 13, further comprising:
further tuning the frequency of the tunable qubit by:
raising the temperature of the tunable qubit device to a temperature above the critical temperature of the superconducting loop but below the critical temperature of each superconducting material of the tunable qubit;
applying a magnetic field to the superconducting loop that is weaker or stronger than a previously applied magnetic field using the flux bias line;
reducing the temperature of the tunable qubit device to a temperature below the critical temperature of the superconducting loop; and
removing the magnetic field applied by the flux bias line.

15. A method of tuning a tunable qubit device comprising a superconducting quantum interference device (SQUID) loop and a bias superconducting loop, comprising:
raising the temperature of the tunable qubit device from a temperature suitable for operation of the tunable qubit to a temperature above a critical temperature of the bias superconducting loop but below a critical temperature of each superconducting material of the SQUID loop;
applying a magnetic field to the bias superconducting loop using a flux bias line;
reducing the temperature of the tunable qubit device to a temperature below the critical temperature of the bias superconducting loop, thereby trapping a flux in the bias superconducting loop;
removing the magnetic field applied by the flux bias line while maintaining the persistent bias current in the bias superconducting loop; and
wherein the magnetic field created by the persistent bias current in the superconducting loop penetrates the SQUID loop, tuning a frequency of the tunable qubit.

16. A method of tuning a tunable qubit device comprising a superconducting quantum interference device (SQUID) loop and a bias superconducting loop, comprising:
raising the temperature of the tunable qubit device from a temperature suitable for operation of the tunable qubit to a temperature above a critical temperature of the bias superconducting loop but below a critical temperature of each superconducting material of the SQUID loop;
applying a magnetic field to the bias superconducting loop using a flux bias line;
reducing the temperature of the tunable qubit device to a temperature below the critical temperature of the bias superconducting loop, thereby trapping a flux in the bias superconducting loop;
removing the magnetic field applied by the flux bias line while maintaining the persistent bias current in the bias superconducting loop; and
further tuning the frequency of the tunable qubit by:
raising the temperature of the tunable qubit device to a temperature above the critical temperature of the superconducting loop but below the critical temperature of each superconducting material of the tunable qubit;
applying a magnetic field to the superconducting loop that is weaker or stronger than a previously applied magnetic field using the flux bias line;
reducing the temperature of the tunable qubit device to a temperature below the critical temperature of the superconducting loop; and
removing the magnetic field applied by the flux bias line,
wherein the magnetic field created by the persistent bias current in the superconducting loop penetrates the SQUID loop, tuning a frequency of the tunable qubit.

17. A quantum computer, comprising:
a refrigeration system under vacuum comprising a containment vessel;
a qubit chip contained within a refrigerated vacuum environment defined by the containment vessel, wherein the qubit chip comprises a plurality of tunable qubit devices; and
a plurality of electromagnetic waveguides arranged within the refrigerated vacuum environment so as to direct electromagnetic energy to and receive electromagnetic energy from at least a selected one of the plurality of tunable qubit devices;
wherein each of the plurality of tunable qubit devices comprises:
a tunable qubit, the tunable qubit comprising a SQUID loop;
a superconducting loop inductively coupled to the SQUID loop; and
a flux bias line inductively coupled to the superconducting loop,
wherein the superconducting loop comprises a superconducting material having a critical temperature that is a lower temperature than a critical temperature of any superconducting material of the tunable qubit, and
wherein, in operation, the superconducting loop provides a persistent bias to the tunable qubit.

18. The quantum computer according to claim 17, wherein the superconducting loop of each tunable qubit device creates a magnetic field that tunes a frequency of the tunable qubit of the tunable qubit device.

19. The quantum computer according to claim 18, wherein the superconducting loop of each tunable qubit device continues to create the magnetic field when no magnetic field is created by the flux bias line of the tunable qubit device.

20. The quantum computer according to claim 17, wherein the superconducting loop comprises one of titanium, zirconium, or hafnium.

* * * * *